United States Patent [19]
El-Sharawy et al.

[11] Patent Number: 6,013,939
[45] Date of Patent: Jan. 11, 2000

[54] MONOLITHIC INDUCTOR WITH MAGNETIC FLUX LINES GUIDED AWAY FROM SUBSTRATE

[75] Inventors: El-Badawy Amien El-Sharawy, Gilbert, Ariz.; Majid M. Hashemi, Sunnyvale, Calif.

[73] Assignee: National Scientific Corp., Phoenix, Ariz.

[21] Appl. No.: 08/962,377

[22] Filed: Oct. 31, 1997

[51] Int. Cl.[7] .............................. H01L 29/00; G01R 1/04
[52] U.S. Cl. .......................................... 257/531; 324/127
[58] Field of Search .......................... 257/531; 324/127; 317/235 R; 336/200; 360/110; 437/60; 340/572

[56] References Cited

U.S. PATENT DOCUMENTS

| | | | |
|---|---|---|---|
| 3,614,554 | 10/1971 | Richardson et al. | 317/235 R |
| 5,070,317 | 12/1991 | Bhagat | 336/200 |
| 5,227,659 | 7/1993 | Hubbard | 257/531 |
| 5,450,263 | 9/1995 | Desaigoudar et al. | 360/110 |
| 5,478,773 | 12/1995 | Dow et al. | 437/60 |
| 5,486,756 | 1/1996 | Kawakami et al. | 324/127 |
| 5,539,241 | 7/1996 | Abidi et al. | 257/531 |
| 5,545,916 | 8/1996 | Koullias | 257/531 |
| 5,563,582 | 10/1996 | D'Hont | 340/572 |
| 5,635,892 | 6/1997 | Ashby et al. | 336/556 |

*Primary Examiner*—Steven H. Loke
*Attorney, Agent, or Firm*—Meschkow & Gresham, P.L.C.; Lowell W. Gresham; Jordan M. Meschkow

[57] ABSTRACT

A monolithic inductor (20, 20') is formed over a silicon or other substrate (22). The inductor (20, 20') includes at least one coil (62, 78) arranged so that its axis (58) is parallel to the substrate (22). Other inductive features, such as other coils (64, 70, 72) or planar spirals (74, 76) are arranged in series with the coil (62, 78) to guide magnetic flux lines away from the substrate (22). In one embodiment, a common thin film coil core (60) made from a magnetic material is provided for two coils (62, 64). The coil core (60) provides a continuous magnetic material flux path through the two coils (62, 64). In another embodiment, an axis (58) of the coil (78) is located between the plane in which two spirals (74, 76) are located and the substrate (22) to guide magnetic flux lines (82) away from the substrate (22).

21 Claims, 3 Drawing Sheets

MONOLITHIC INDUCTOR WITH MAGNETIC FLUX LINES GUIDED AWAY FROM SUBSTRATE

TECHNICAL FIELD OF THE INVENTION

The present invention relates generally to the field of monolithic inductors. More specifically, the present invention relates to monolithic inductors configured to guide magnetic flux lines away from the substrate on which the inductors are formed.

BACKGROUND OF THE INVENTION

The integration of passive inductors on integrated circuits with active components and other passive components improves performance and reduces manufacturing costs. The most successful form of a monolithic passive inductor is a conductive spiral formed in a plane parallel to the substrate. Magnetic flux lines from this spiral inductor extend perpendicular to the substrate, and hence into the substrate. The spiral inductor has been particularly successful when formed on gallium arsenide (GaAs) substrates. GaAs-based processes are much more expensive than the less exotic silicon (Si) based processes. Accordingly, GaAs substrates are typically used only when Si substrates are not suitable for the application. Higher frequency (e.g. >3 GHz) applications are particularly suited to GaAs implementations. At these higher frequencies, passive inductors having inductance values in the range of 1 nH or smaller are often sufficient. Such small valued inductors may be formed as spirals using little die area. Moreover, since GaAs is a semi-insulative material, losses are small nd high quality factors (Q's) can be obtained.

However, at lower frequencies where less exotic and much less expensive Si-based processes can be used (e.g. <3 GHz), passive monolithic inductors tend to be less successful. At these lower frequencies, passive inductors having greater inductance values are required by circuit designs. These larger inductance values are difficult to achieve. Larger die area is required to achieve larger inductance values, other factors remaining unchanged. Moreover, Si has much higher conductivity than GaAs. Consequently, the coupling of flux lines into the Si substrate causes greater inductive losses and a lower Q when compared to a GaAs substrate. The lower Q can be somewhat compensated for by still larger inductance values which require even more die area to implement. Unfortunately, as the die area used to implement a given inductance value increases, the parasitic capacitance also increases. This leads to a lowering of self resonance that can make the inductor fail at even low frequencies.

Attempts have been made at forming types of monolithic passive inductors other than spiral inductors. One promising type of passive monolithic inductor is a coil inductor having a coil axis parallel to the substrate. This type of passive inductor is promising because a portion of the inductor flux lines do not naturally pass through the substrate. Consequently, losses can be reduced when Si substrates are used. While coil inductors are promising, they have nevertheless met with little success, and designers are too often forced to use active inductors or inductor components external to an integrated circuit chip.

The limited success of coil inductors has been due, at least in part, to an inability to generate sufficiently high inductance values for a given small die area and to reliance upon processing requirements that are incompatible with standard Si-based processing. High inductance values from a given small die area have been elusive for conventional passive monolithic coil inductors because conventional devices fail to adequately guide magnetic flux lines away from the substrate. This leads to losses which are typically compensated for with larger than desirable geometric structures that exhibit undesirably high parasitic capacitances. The use of magnetic materials to channel and guide flux lines helps, but conventional devices fail to provide complete magnetic circuits. As a result, the portion of a magnetic flux circuit that passes through a non-magnetic material exerts a great inductance-limiting influence on the resulting inductance.

Incompatible or otherwise unusual processing requirements are undesirable because they lead to low yield devices and to increased costs. One example of incompatible processing uses multiple magnetic material layers. The use of a single magnetic material layer is an atypical processing requirement that is accommodated only by accepting increased risk. Risks are increased because magnetic materials used in semiconductor processing tend to be considerably harder and to have vastly different coefficients of thermal expansion than more usual semiconductor materials. These risks are increased as more magnetic material layers are used, as the magnetic material layer nears an active semiconductor layer or as it becomes thicker. The use of multiple layers of such materials, placement of such materials near active layers, or the use of thick layers of such materials leads to low yields and increased costs.

SUMMARY OF THE INVENTION

Accordingly, it is an advantage of the present invention that an improved monolithic inductor is provided in which magnetic flux lines are largely guided away from a semiconductor substrate.

Another advantage of the present invention is that a monolithic inductor is provided which uses one or fewer layers of a magnetic material.

Another advantage of the present invention is that a monolithic inductor is provided in which no more than a single relatively thin magnetic material layer is used, and this magnetic material layer is spaced a considerable distance away from active components.

Another advantage of the present invention is that multiple inductive features are used to guide and couple magnetic flux lines through the inductive features to greatly reduce their paths through an underlying substrate.

Another advantage of the present invention is that a monolithic inductor is provided which achieves a relatively high inductance value in a relatively small die area with a high Q and high self resonance.

Another advantage of the present invention is that a monolithic inductor is provided which is suitable for formation on a silicon substrate.

The above and other advantages of the present invention are carried out in one form by a monolithic inductor formed on a semiconductor substrate which extends substantially in a plane. The inductor has magnetic flux lines guided away from the substrate. The inductor includes a first coil having a first axis. This first coil is formed on the substrate so that the first axis is substantially parallel to the plane of the substrate. A second coil has a second axis and is formed on the substrate so that the second axis is substantially parallel to the plane of the substrate. The second coil is electrically connected in series with the first coil so that electrical current advances in substantially opposing directions along the first and second axes through the first and second coils. A coil core is formed from a magnetic material and configured so that a substantially continuous path of magnetic material passes through the first and second coils along the first and second axes.

The above and other advantages of the present invention are carried out in another form by a monolithic inductor formed on a semiconductor substrate which extends substantially in a plane. The inductor has a magnetic field guided away from the substrate. A first conductive spiral of the inductor has a first axis and is formed on the substrate so that the first axis is substantially perpendicular to the substrate plane. A second conductive spiral of the inductor has a second axis and is formed on the substrate so that the second axis is substantially perpendicular to the substrate plane and substantially parallel to the first axis. A conductive coil of the inductor has a third axis and is formed on the substrate so that the third axis is substantially parallel to the plane. The coil is electrically coupled in series with the first and second spirals. The coil is physically located between the first and second spirals.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
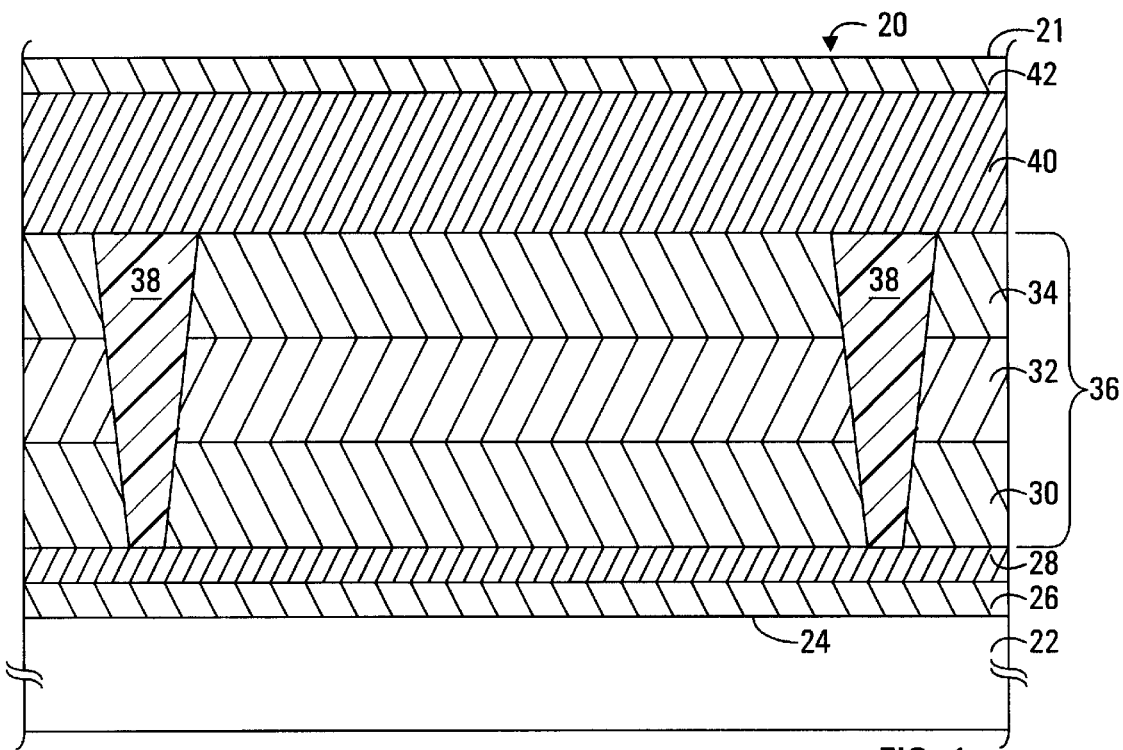
FIG. 1 shows a first cross-sectional side view of a monolithic inductor configured in accordance with the present invention.

FIG. 1 shows a first cross-sectional side view of a monolithic inductor 20 configured in accordance with the present invention. In the preferred embodiments, inductor 20 is formed as part of an integrated circuit (IC) 21 on a monolithic substrate 22 which may, but is not required to, be formed from silicon (Si). Substrate 22 of IC 21 may have any number of transistors (not shown) or other devices formed therein. As is conventional, substrate 22 has a planar geometry, and the active devices are formed at a planar surface 24 of substrate 22.

An insulating layer 26 is applied over surface 24 of substrate 22. Layer 26 may be formed from $SiO_2$ to a thickness of 1–2 microns, but the material selection and thickness are not critical parameters. Although not shown in FIG. 1, vias may be formed through layer 26 to provide paths for electrical connections to the active devices in substrate 22.

After depositing layer 26, an electrically conductive layer 28 is deposited over layer 26. Layer 28 is desirably a metal layer formed using a conventional semiconductor processing compatible metal, (e.g. Al or Cu) and may include additional buffering layers. Layer 28 can be deposited by sputtering, but the deposition technique is not critical. Layer 28 is desirably deposited to a thickness as great as possible within the constraints of standard processing techniques. Greater thicknesses are desirable because greater thicknesses lower the resistance of inductor 20. In the preferred embodiments, layer 28 is deposited to a thickness of 1–2 microns. After depositing layer 28, layer 28 is patterned and etched using conventional techniques. The patterns that are used in the formation of inductor 20 are discussed below in connection with FIGS. 3–9.

After patterning and etching electrically conductive layer 28, an insulative layer 30 is applied over layer 28. Layer 30 is desirably formed to a thickness in the range of 1–15 microns. The inductance value of a coil inductor is proportional to the square of the coil's diameter. As is discussed below in more detail, the thickness of layer 30 contributes to the diameter of a coil. Consequently, a thicker layer 30 is more desirable than a thinner layer 30 to achieve greater inductance values. In addition, a thicker layer 30 spaces subsequent layers farther away from surface 24 of substrate 22 to further isolate physical incompatibilities of the subsequent layers from substrate 22. A CVD silicon oxide, polyimide or spin-on glass process can be used in a manner well understood to those skilled in the art to form layer 30.

After the formation of insulative layer 30, a magnetic material layer 32 is applied. Layer 32 is formed from a thin film ferromagnetic or ceramic composite magnetic material, such as a ferrite oxide combination ($Fe_3O_4$) or other magnetic materials known to those skilled in the art. Desirably, the magnetic material exhibits low conductivity. Layer 32 is desirably spaced as far away from surface 24 of substrate 22 as is reasonably practical because conventional magnetic materials used for layer 32 tend to be somewhat incompatible with substrate 22 in hardness and thermal expansion. In addition, care is exercised to insure that layer 32 is not too thick because excessive thickness of layer 32 can exacerbate incompatibilities with substrate 22. In the preferred embodiment, layer 32 is desirably maintained at a thickness less than 15 microns, with a thickness in the range of 1–10 microns being preferred for processing compatibility purposes. Layer 32 can be applied through sputtering. After application, layer 32 may, but need not, be patterned and etched to form magnetic material patterns that are discussed below in connection with FIGS. 3–9.

Following formation of layer 32, an insulative layer 34 is formed over layer 32. Layer 34 complements layer 30 and is desirably formed to a thickness in the range of 1–15 microns so that magnetic material layer 32 resides approximately in the center of a center coil region 36 that includes layers 30, 32 and 34. A CVD silicon oxide, polyimide or spin-on glass process can be used in a manner well understood to those skilled in the art to form layer 34.

After forming insulative layer 34, electrically conductive plugs 38 are formed to extend through center coil region 36 to physically and electrically contact conductive layer 28. Plugs 38 can be formed by first patterning and etching to form vias through coil center region 36. A selective CVD process using tungsten (W) is then desirably used to cause plugs 38 to form in the vias. Next, a photoresist planarization process is performed to level the top of substrate 22, followed by iterative planarization etchback steps that evenly remove the photoresist and metal.

After forming conductive plugs 38, an electrically conductive layer 40 is deposited over coil center region 36 so that layer 40 physically and electrically contacts plugs 38. Layer 40 is desirably a metal layer formed using a conventional semiconductor processing compatible metal, (e.g. Al or Cu) and may include additional buffering layers. Layer 40 can be deposited by sputtering, but the deposition technique is not critical. Layer 40 is desirably deposited to a thickness as great as possible within the constraints of standard processing techniques. Greater thicknesses are desirable because greater thicknesses lower the resistance of inductor 20. Unlike conductive layer 28, discussed above, layer 40 may be deposited to a greater thickness because few subsequent processing steps are required. Thicknesses of 5–20 microns or greater are acceptable. After depositing layer 40, layer 40 is patterned and etched using conventional techniques. The patterns that are used in the formation of inductor 20 are discussed below in connection with FIGS. 3–9.

Following the formation and patterning of layer 40, a passivation layer 42 may be applied, and IC 21 completed in accordance with standard processing techniques.

Figure 2:
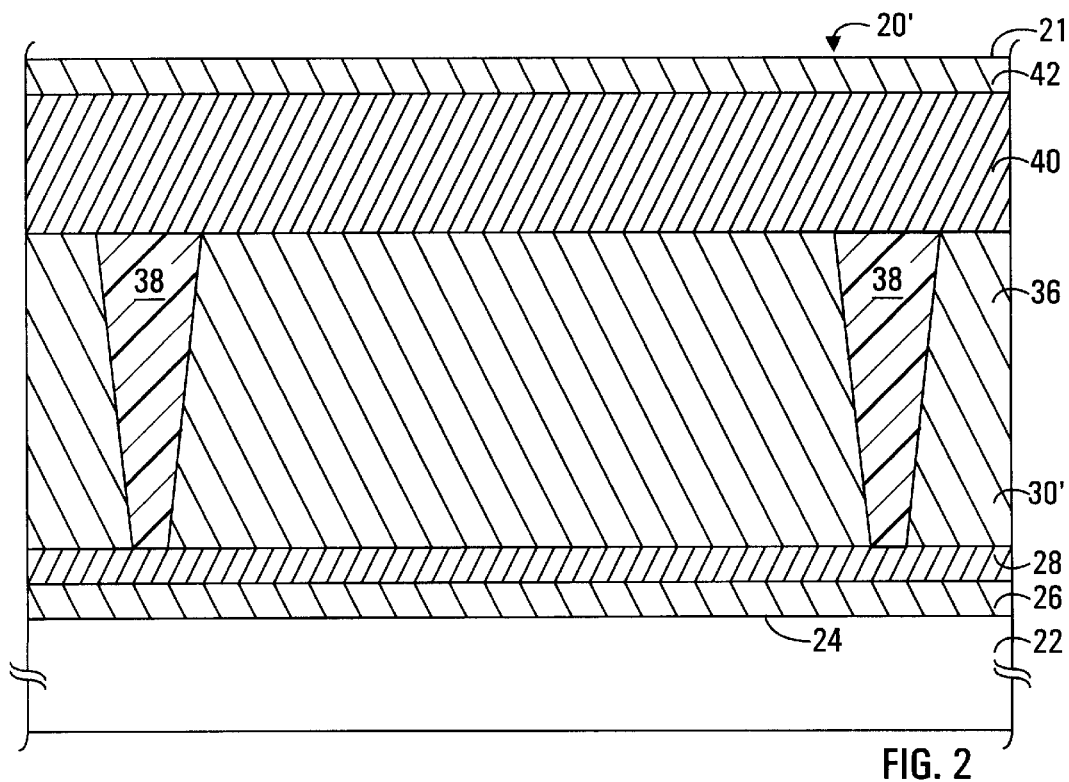
FIG. 2 shows a second cross-sectional side view of a monolithic inductor configured in accordance with the present invention.

FIG. 2 shows a second cross-sectional side view of a monolithic inductor 20' configured in accordance with the present invention. Inductor 20' is similar to inductor 20, with differences between the two inductors being found in center coil region 36. While inductor 20 includes layers 30, 32 and 34 in center coil region 36 (FIG. 1), inductor 20' includes only a layer 30' for center coil region 36. Layer 30' is an insulative layer applied over layer 28. Layer 30' is desirably formed to a thickness in the range of 5–50 microns. The larger the thickness value, the greater the coil diameter and the greater the resulting inductance value of inductor 20'. A CVD silicon oxide, polyimide or spin-on glass process can be used in a manner well understood to those skilled in the art to form layer 30'.

Accordingly, inductor 20' differs from inductor 20 (FIG. 1) since magnetic material layer 32 (FIG. 1) is omitted from inductor 20'. The omission of magnetic material layer 32 is desirable because this makes the manufacturing process less risky, and a less risky manufacturing process leads to higher yields and lower costs. However, the omission of magnetic material layer 32 may come at the cost of achieving a lower inductance value for a given die area than can be achieved by inductor 20.

Figure 3:
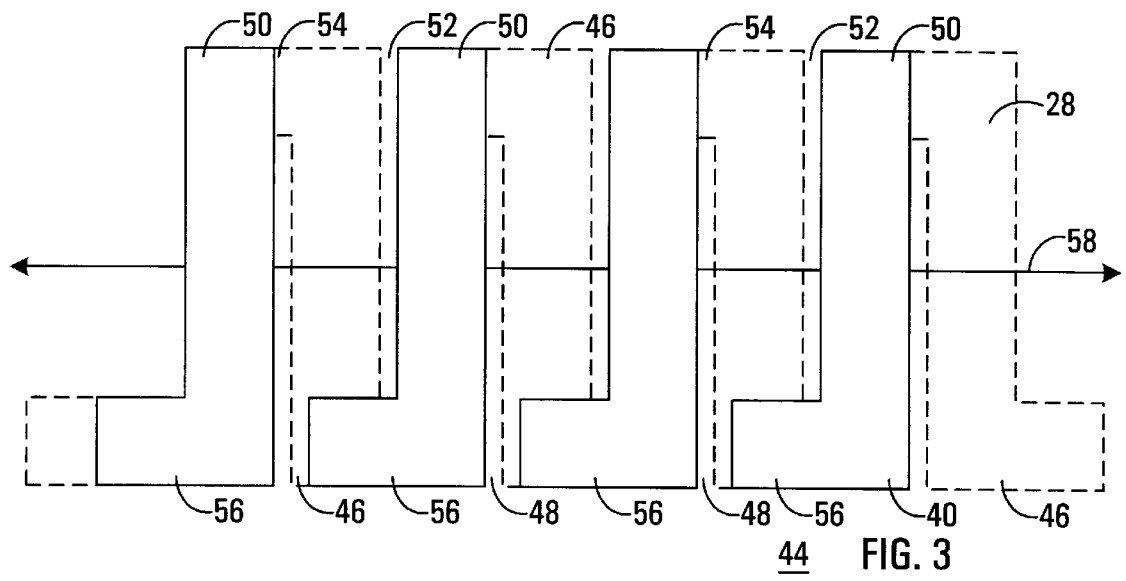
FIG. 3 shows a top view of a coil which forms a portion of a monolithic inductor configured in accordance with the present invention.

FIG. 3 shows a top view of a coil 44 which forms a portion of inductors 20 (FIG. 1) and 20' (FIG. 2). Layers of IC 21 which are not essential for understanding coil 44 are omitted. Dotted lines in FIG. 3 show spaced apart lower traces 46 that are formed in conductive layer 28. Land areas 48 reside between traces 46. Solid lines depict spaced apart upper traces 50 that are formed in conductive layer 40. Traces 50 are spaced apart by land areas 52.

In the embodiment depicted in FIG. 3, upper traces 50 overlay land areas 48, and lower traces 46 underlie land areas 52, with trace extensions 54 of lower traces 46 extending under upper traces 50 and trace extensions 56 of upper traces 50 extending over lower traces 46. This configuration is desirable because it confines traces to extend only in directions which are perpendicular to one another for efficient layout using conventional semiconductor manufacturing photolithographic techniques. Moreover, it spaces lower traces 46 apart from upper traces 50 to lower parasitic capacitance. However, in other applications, such as lower frequency applications where low self-resonance may not present a problem, upper traces 50 can directly overlie lower traces 46 to provide more coil turns for a given die area. Providing more coil turns for a given die area leads to a higher inductance value, but causing upper traces 50 to overlie lower traces 46 also increases parasitic capacitance.

Figure 4:
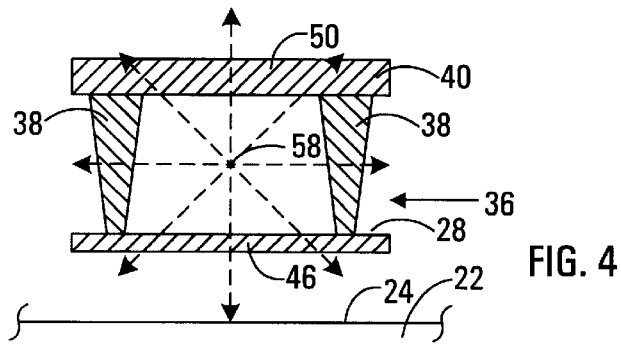
FIG. 4 shows a side view of the coil of FIG. 3.

FIG. 4 shows a side view of coil 44. Referring to FIGS. 3 and 4, plugs 38 electrically interconnect upper traces 50 to lower traces 46 at trace extensions 54 and 56. Accordingly, coil 44 is formed from lower traces 46 and their trace extensions 54, upper traces 50 and their trace extensions 56, and conductive plugs 38. Coil 44 has a coil axis 58 that extends substantially parallel to surface 24 of substrate 22. Coil 44 is desirably laid out so that axis 58 is substantially straight for efficient layout using conventional semiconductor photolithographic techniques so that greater inductance values can be obtained using smaller die areas. Depending on whether inductor 20 (FIG. 1) or inductor 20' (FIG. 2) is being formed, a coil core formed of a magnetic material can be centrally disposed between upper and lower traces 50 and 46 of coil 44.

FIG. 4 shows hypothetical dotted magnetic flux lines that could radiate away from axis 58 at an end of coil 44, when an electrical current flows therethrough. However, such a pattern of flux lines would be undesirable because a portion of the flux lines pass into substrate 22. Accordingly, coil 44 is combined with other inductive features in a manner discussed below to guide magnetic flux lines away from substrate 22.

Figure 5:
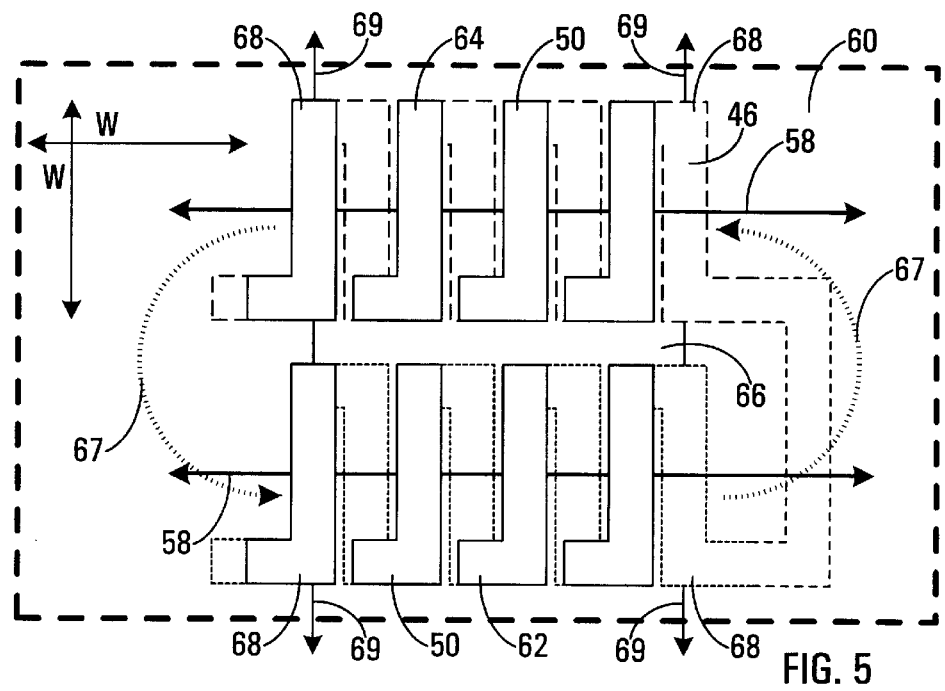
FIG. 5 shows a top view of a first embodiment of a monolithic inductor configured in accordance with the present invention.
Figure 6:
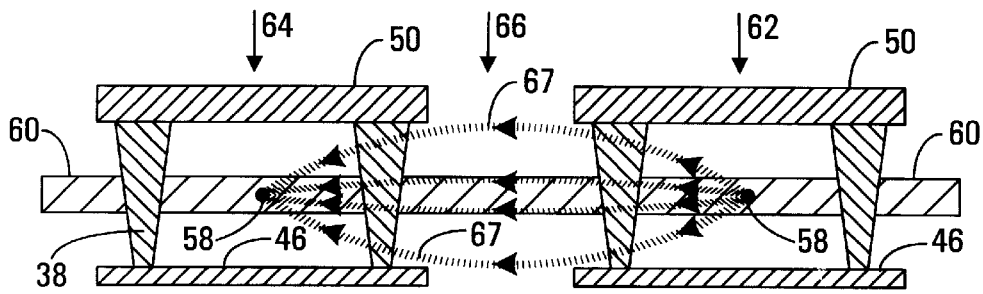
FIG. 6 shows a side view of the first embodiment depicted in FIG. 5.

FIG. 5 shows a top view of a first embodiment of monolithic inductor 20 configured in accordance with the present invention. FIG. 6 shows a side view of the first embodiment depicted in FIG. 5. Referring to FIGS. 5 and 6, inductor 20 desirably includes a coil core 60 formed from a magnetic material in magnetic material layer 32, as discussed above in connection with FIG. 1 and two coils 62 and 64. Coils 62 and 64 are each desirably formed as discussed above in connection with FIGS. 1 and 3–4. Coil 62 is desirably placed closely beside coil 64 so that a maximum inductance value is achieved for the die area used by inductor 20. Desirably, axis 58 for coil 62 parallels axis 58 for coil 64. Coil core 60 is desirably configured to cover a greater die area than is covered by coil 62, coil 64 and an inter-coil gap area 66, which resides between coils 62 and 64.

In the preferred embodiments, traces 50 and 46 define a width W for their respective coils 62 and 64. Each of coils 62 and 64 includes a plurality of turns, where each turn includes a trace 50 and 46. The turns are roughly confined between end traces 68. Coil core 60 desirably extends beyond the die area covered by coils 62 and 64 at end traces 68 by a length of at least W. This permits a continuous path of magnetic material through both of coils 62 and 64. By using a substantially continuous magnetic material path, the resulting inductance value is not severely limited by passing magnetic flux lines through dielectric regions. A dotted magnetic flux line 67 in FIGS. 5 and 6 indicates a magnetic flux circuit which extends through coils 62 and 64. Coil core 60 at the level of coil axes 58 vertically concentrates the magnetic flux lines in coil core 60 rather than letting the flux lines extend radially outward, as shown in FIG. 4.

Moreover, coils 62 and 64 are electrically connected in series so that electrical current advances in opposing directions along coil axes 58 of coils 62 and 64. Accordingly, magnetic flux lines in each of coils 62 and 64 are pulled or guided toward the center of the other of coils 62 and 64 rather than extending radially outward, as shown in FIG. 4. This cancels the magnetic flux in inter-coil gap area 66 and confines the flux to the loop shared by coils 62 and 64.

Accordingly, rather than forming an undesirably thick but small coil core, the preferred embodiment uses a thinner common coil core that is spread out in area to extend beyond the physical dimensions outlined by multiple coils. This permits a complete magnetic flux path to pass through multiple coils in the common magnetic material. At the same time, it permits magnetic material layer 32 (FIG. 1) to remain as thin as possible to limit the risk of incompatibility with underlying substrate 22. Conductive plugs 38 (FIGS. 1 and 4) desirably pass through coil core 60 and even contact layer 32 which forms coil core 60. No shorting occurs due to the low conductivity of the magnetic materials used in forming coil core 60. While FIG. 5 shows coil core 60 having a particular pattern overlying a particular area of IC 21, nothing requires coil core 60 to exhibit any pattern. In other words, magnetic material layer 32 (FIG. 1) is not required to be patterned and etched to form the pattern illustrated in FIG. 5 but may extend over the entire surface of IC 21.

In order to obtain a maximum amount of magnetic flux coupling between coils 62 and 64 for a minimum amount of die area, coils 62 and 64 are placed even with one another. In other words, coils 62 and 64 are located so that perpendicular lines 69 to axes 58 of coils 62 and 64 pass through one end trace 68 for coil 62 and one end trace for coil 64 at each end of coils 62 and 64.

Figure 7:
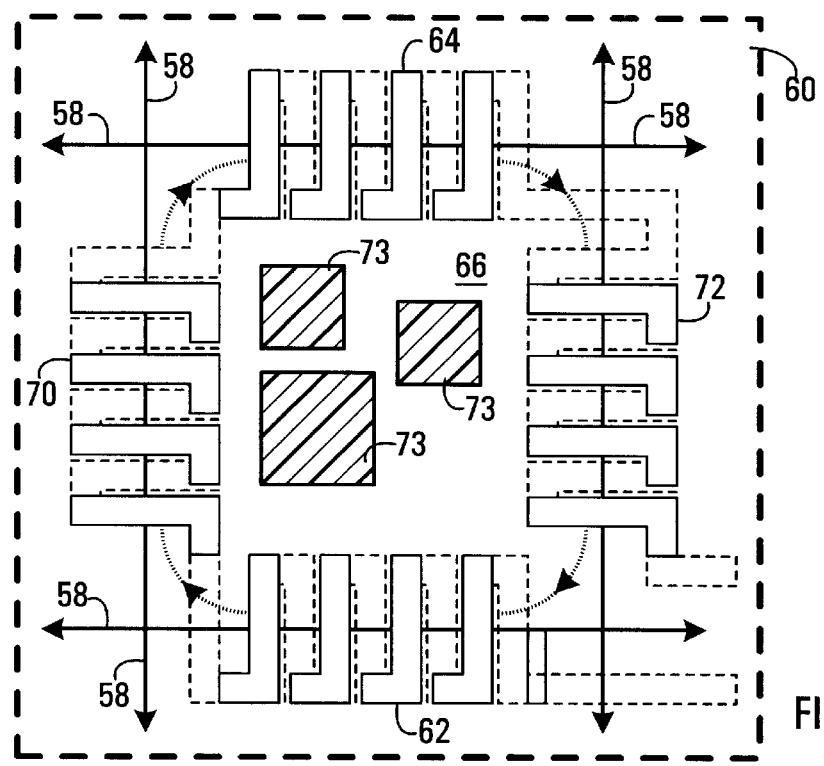
FIG. 7 shows a top view of a second embodiment of a monolithic inductor configured in accordance with the present invention.

FIG. 7 shows a top view of a second embodiment of monolithic inductor 20 configured in accordance with the present invention. The second embodiment resembles the first embodiment depicted in FIG. 5. However, coils 70 and 72 have been added to inductor 20. Coils 70 and 72 are each desirably formed as discussed above in connection with FIGS. 1 and 3–4. Coils 70 and 72 are desirably oriented so that their axes 58 are parallel to each other but perpendicular to the axes 58 of coils 62 and 64. Coil 70 is placed at a first end of coils 62 and 64 while coil 72 is placed at a second end of coils 62 and 64. The resulting inductor structure resembles a square with coils along each side of the square. Coils 64, 72, 62 and 70 are electrically connected in series so that current advances through coils 64 and 62 in opposing directions and so that current advances through coils 70 and 72 in opposing directions. Coil core 60 is configured to cover an area greater than the entire die area outlined by coils 62, 64, 70 and 72, including inter-coil gap area 66.

In comparing the FIG. 7 embodiment of inductor 20 with the FIG. 5 embodiment of inductor 20, an improved coupling of magnetic flux is achieved and an improved ability to guide magnetic flux lines away from substrate 22. Consequently, higher inductance values and higher Q values are achieved. However, inter-coil gap area 66 is significantly larger in this FIG. 7 embodiment than in the FIG. 5 embodiment. Thus, the inductance value achieved for a given die area may be lower in this FIG. 7 embodiment. Nevertheless, this FIG. 7 embodiment may be particularly desirable in applications where other components 73, such as capacitors or resistors, are located in inter-coil gap area 66 to efficiently use area 66.

Figure 8:
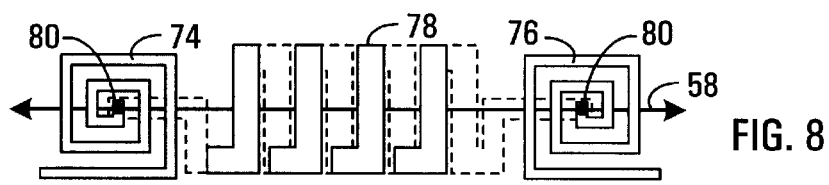
FIG. 8 shows a top view of a third embodiment of a monolithic inductor configured in accordance with the present invention.
Figure 9:
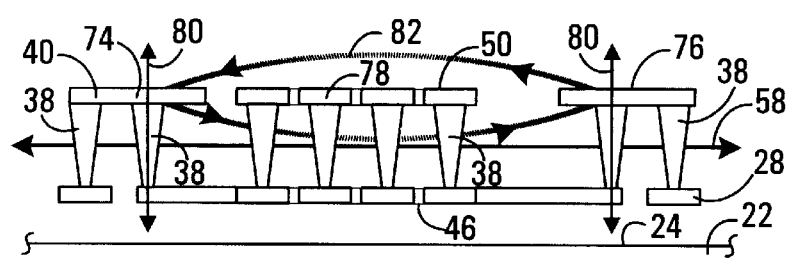
FIG. 9 shows a side view of the third embodiment depicted in FIG. 8.

FIG. 8 shows a top view and FIG. 9 shows a side view of monolithic inductor 20'. Referring to FIGS. 8 and 9, inductor 20' desirably omits a coil core 60 (FIGS. 5–7), as discussed above in connection with FIG. 2. Rather, inductor 20' includes spirals 74 and 76 and a coil 78. Coil 78 is desirably formed as discussed above in connection with FIGS. 2 and 3–4. Spirals 74 and 76 are desirably formed by the patterning and etching of conductive layer 40 (FIG. 2).

Coil 78 is physically located between spirals 74 and 76 and electrically connected in series with spirals 74 and 76. As shown in FIG. 9, conductive layer 28 couples the ends of coil 46 to the centers of spirals 74 and 76 through two conductive plugs 38, thereby effecting the electrical series connection. Spirals 74 and 76 have axes 80 which extend perpendicular to substrate 22 but parallel to each other. Axes 80 desirably intersect axis 58 of coil 78, which extends parallel to substrate 22 as discussed above. Magnetic flux lines for spirals 74 and 76 exit and enter spirals 74 and 76 in the directions indicated by axes 80. In other words, magnetic flux lines for spirals 74 and 76 are directed toward substrate 22. However, spirals 74 and 76 are desirably wound in opposing directions (i.e. clockwise and counterclockwise) so that their magnetic flux lines point in opposing directions for a given current direction.

As best viewed in FIG. 9, the plane on which axis 58 of coil 78 resides lies between surface 24 of substrate 22 and the planes on which spirals 74 and 76 reside. Of course, spirals 74 and 76 are both desirably formed in a common conductive layer 40 (FIG. 2). Accordingly, magnetic flux lines, as illustrated by a dotted line 82 in FIG. 9, aimed toward substrate 22 from spirals 74 and 76 are, for the most part, guided through coil 78 rather than passed into substrate 22. Likewise, magnetic flux lines that would otherwise extend radially outward from coil 78 toward substrate 22, as shown in FIG. 4, are instead guided toward the center of spirals 74 and 76. Since magnetic flux lines are guided away from substrate 22, losses are reduced and Q improved. Moreover, the mutual coupling between spirals 74 and 76 and coil 78 produces a marked rise of overall inductance value. Locating spirals 74 and 76 near coil 78 improves this mutual coupling which leads to higher inductance values. Likewise, aligning axes 80 of spirals 74 and 76 with the axis 58 of coil 78 further improves this mutual coupling.

In summary, the present invention provides an improved monolithic inductor in which magnetic flux lines are largely guided away from the semiconductor substrate. The inductor uses one or fewer layers of a magnetic material. No more than a single relatively thin magnetic material layer is used, and this magnetic material layer is spaced a considerable distance away from active components. Multiple inductive features, such as coils and spirals, are used to guide and couple magnetic flux lines through the inductive features to greatly reduce their paths through an underlying substrate. A relatively high inductance value is achieved in a relatively small die area with a high Q and high self resonance. The monolithic inductor of the present invention is suitable for formation on a silicon substrate.

The present invention has been described above with reference to preferred embodiments. However, those skilled in the art will recognize that changes and modifications may be made in these preferred embodiments without departing from the scope of the present invention. These and other changes and modifications which are obvious to those skilled in the art are intended to be included within the scope of the present invention.

What is claimed is:

1. A monolithic semiconductor inductive component comprising:

a semiconductor substrate which extends substantially in a plane;

a first coil having a first axis and being formed on said substrate so that said first axis is substantially parallel to said plane;

a second coil having a second axis and being formed on said substrate so that said second axis is substantially parallel to said plane, said second coil being electricaly connected in series with said first coil so that electrical current advances in substantially opposing directions along said first and second axes through said first and second coils, respectively; and a coil core formed on said substrate and formed from a magnetic material and configured so that a substantially continuous path of magnetic material passes through said first and second coils along said first and second axes; wherein said first coil, said second coil, and said coil core form a monolithic inductor having magnetic flux lines guided away front said substrate.

2. An inductive component as claimed in claim 1 wherein said first and second axes are substantially straight and said first and second axes are substantially parallel to one another.

3. An inductive component as claimed in claim 2 additionally comprising a third coil having a third axis and being formed on said substrate so that said third axis is substantially parallel to said plane and substantially perpendicular to said first and second axes, said third coil being electrically connected in series between said first and second coils.

4. An inductive component as claimed in claim 3 additionally comprising a fourth coil having a fourth axis and being formed on said substrate so that said fourth axis is substantially parallel to said plane and substantially parallel to said third axis, said fourth coil being electrically connected in series with one of said first and second coils so that electrical current advances in substantially opposing directions along said third and fourth axes through said third and fourth coils, respectively.

5. An inductive component as claimed in claim 1 wherein:
said first coil overlies a first area on said substrate;
said second coil overlies a second area on said substrate; and
said coil core overlies the entirety of said first and second areas.

6. An inductive component as claimed in claim 5 wherein:
said first and second coils are spaced apart from one another by an inter-coil gap area; and
said coil core overlies an area of said substrate which is greater than said first and second areas plus said inter-coil gap area.

7. An inductive component as claimed in claim 5 wherein:
said first coil includes a plurality of spaced apart traces, said traces extending for a width distance in a direction substantially parallel to said plane and perpendicular to said first axis; and
said coil core overlies an area of said substrate which extends at least substantially said width distance beyond said traces along said first axis.

8. An inductive component as claimed in claim 1 wherein:
said first coil includes first and second end traces spaced apart from one another along said first axis;
said second coil includes third and fourth end traces spaced apart from one another along said second axis;
said first and second axes are substantially parallel to one another; and
said first and third end traces are positioned proximate a first line passing substantially perpendicularly through said first and second axes.

9. An inductive component as claimed in claim 8 wherein:
said second and fourth end traces are positioned proximate a second line passing perpendicularly through said first and second axes.

10. An inductive component as claimed in claim 1 wherein said substrate is formed substantially of silicon.

11. An inductive component as claimed in claim 1 wherein:
a first insulative layer overlies said substrate;
a first electrically conductive layer overlies said first insulative layer, said first electrically conductive layer being formed into first spaced apart traces;
a second insulative layer overlies said first conductive layer;
a magnetic material layer overlies said second insulative layer;
a third insulative layer overlies said magnetic material layer;
a second electrically conductive layer overlies said third insulative layer, said second electrically conductive layer being formed into second spaced apart traces;
a plurality of electrically conductive plugs extending from said first traces to said second traces through said second and third insulative layers; and
said first traces, said second traces and said conductive plugs are configured to form said first coil and to form said second coil; and
said magnetic material layer forms said coil core.

12. An inductive component as claimed in claim 11 wherein said magnetic material layer is less than 15 microns thick.

13. An inductive component as claimed in claim 11 wherein:
said magnetic material layer is dimensioned to overlie a substantially continuous area over said first traces; and
said conductive plugs extend through and contact said magnetic material layer.

14. A monolithic semiconductor inductive component comprising:
a semiconductor substrate which extends substantially in a plane;
a first conductive spiral having a first axis and being formed on said substrate so that said first axis is substantially perpendicular to said plane;
a second conductive spiral having a second axis and being formed on said substrate so that said second axis is substantially perpendicular to said plane and substantially parallel to said first axis; and
a conductive coil having a third axis and being formed on said substrate so that said third axis is substantially parallel to said plane, said coil being electrically coupled in series with said first and second spirals, and said coil being physically located between said first and second spirals; wherein
said first conductive spiral, said second conductive spiral, and said conductive coil form a monolithic inductor having magnetic flux lines guided away from said substrate.

15. An inductive component as claimed in claim 14 wherein said first and second axes reside proximate a line extending along said third axis.

16. An inductive component as claimed in claim 14 wherein:
said first spiral is spaced apart from said plane of said substrate;

said second spiral is spaced apart from said plane of said substrate;

said third axis is positioned between said plane of said substrate and said first spiral; and said third axis is positioned between said plane of said substrate and said second spiral.

17. An inductive component as claimed in claim 14 wherein:

magnetic flux lines for said first spiral point in a first direction along said first axis;

magnetic flux lines for said second spiral point in a second direction along said second axis; and said first direction opposes said second direction.

18. An inductive component as claimed in claim 14 wherein said substrate is formed substantially of silicon.

19. An inductive component as claimed in claim 14 wherein:

a first insulative layer overlies said substrate;

a first electrically conductive layer overlies said first insulative layer, said first electrically conductive layer being formed into first spaced apart traces;

a second insulative layer overlies said first conductive layer;

a second electrically conductive layer overlies said second insulative layer, said second electrically conductive layer being formed into said first spiral, said second spiral, and second spaced apart traces;

a plurality of electrically conductive plugs extending from said first traces to said second traces through said second insulative layer; and said first traces, said second traces and said conductive plugs are configured to form said coil.

20. A monolithic semiconductor inductive component comprising:

a semiconductor substrate which extends substantially in a plane;

a first coil formed on said substrate to overlie a first area of said substrate, said first coil having a first axis extending substantially parallel to said plane;

a second coil formed on said substrate to overlie a second area of said substrate, said second coil having a second axis extending substantially parallel to said plane and to said first axis, said second coil being spaced apart from said first coil by an inter-coil gap area, and said second coil being electrically connected in series with said first coil so that electrical current advances in substantially opposing directions along said first and second axes through said first and second coils, respectively; and a coil core formed on said substrate and formed of a magnetic material and configured to overlie an area of said substrate that extends beyond said first area, said second area and said inter-coil gap area so that a substantially continuous path of magnetic material passes through said first and second coils along said first and second axes; wherein said first coil, said second coil, and said coil core form a monolithic inductor having magnetic flux Lines guided away from said substrate.

21. A monolithic semiconductor inductive component comprising:

a semiconductor substrate having a planar surface;

a conductive coil having a coil axis and being formed on said substrate so that said coil axis extends along a line substantially parallel to said planar surface of said substrate;

a first conductive spiral formed on said substrate and spaced apart from said planar surface, said first spiral having a first axis line that is substantially perpendicular to said planar surface and proximate said line along which said coil axis extends; and a second conductive spiral formed on said substrate and spaced apart from said planar surface, said second spiral having a second axis line that is substantially perpendicular to said planar surface and proximate said line along which said coil axis extends;

wherein said conductive coil, said first conductive spiral, and said second conductive spiral form a monolithic inductor having magnetic flux lines guided away from said substrate, said coil is located between said first and second conductive spirals, said coil is electrically coupled in series with said first and second spirals so that magnetic flux lines for said first spiral and for said second spiral point in substantially opposing directions, and said coil axis is positioned between said planar surface of said substrate and said first spiral and between said planar surface of said substrate and said second spiral.

* * * * *